United States Patent [19]
Yeates

[11] Patent Number: 5,278,404
[45] Date of Patent: Jan. 11, 1994

[54] OPTICAL SUB-SYSTEM UTILIZING AN EMBEDDED MICRO-CONTROLLER

[75] Inventor: Paul D. Yeates, Longswamp Township, Berks County, Pa.

[73] Assignee: AT&T Bell Laboratories, Murray Hill, N.J.

[21] Appl. No.: 916,934

[22] Filed: Jul. 20, 1992

[51] Int. Cl.⁵ .............................................. H01J 40/14
[52] U.S. Cl. ................................ 250/214 C; 250/205; 372/34
[58] Field of Search ...................... 250/214; 356/73.1; 372/29, 31, 32, 34, 36, 38

[56] References Cited

U.S. PATENT DOCUMENTS

| | | | |
|---|---|---|---|
| 3,835,313 | 9/1974 | Stiefelmeyer et al. | 250/214 C |
| 4,870,699 | 9/1989 | Garner et al. | 455/76 |
| 4,924,191 | 5/1990 | Erb et al. | 330/130 |
| 5,018,154 | 5/1991 | Ohashi | 372/34 |
| 5,036,189 | 7/1991 | Geller | 250/205 |
| 5,118,964 | 6/1992 | McArdle | 372/34 |
| 5,144,632 | 9/1992 | Thonn | 372/34 |

Primary Examiner—David C. Nelms
Assistant Examiner—S. B. Allen
Attorney, Agent, or Firm—Wendy W. Koba

[57] ABSTRACT

An optical sub-system is disclosed which includes an embedded micro-controller for providing continuous monitoring and adjusting of various operating parameters associated with the sub-system. The ability to modify various parameters such as bias voltage, optical signal power, etc., as a function of changes in the environment (e.g., ambient temperature, device age, power supply) results in optimization of the sub-system. The micro-controller is initially programmed during environmental testing in manufacture to provide a memory within the micro-controller which includes the optimal values for a preselected set of operating parameters as a function of various environmental conditions.

6 Claims, 3 Drawing Sheets

OPTICAL SUB-SYSTEM UTILIZING AN EMBEDDED MICRO-CONTROLLER

BACKGROUND OF THE INVENTION

1. Technical Field

The present invention relates to performance optimization of an optical sub-system and, more particularly to utilizing an embedded micro-controller to provide the optimization.

2. Description of the Prior Art

In most optical communication systems, various sub-system arrangements (for example, transmitters, receivers, amplifiers, regenerators) exhibit variations in performance as a function of ambient temperature, device aging, power supply fluctuations, input signal levels, etc. (referred to categorically hereinafter as "environmental" changes). Analog feedback circuitry is often utilized to provide a moderate degree of control in some situations as, for example, controlling the bias voltage applied to a laser transmitter, the transimpedance gain of a receiver pre-amplifier, the gain of an optical amplifier, or various combinations of the above.

It has been recognized that such a discrete, analog circuit approach to the problem of sub-system stability results in increasing the size, cost, and complexity of the associated sub-system arrangement. Additionally, each analog circuit must, in most cases, be individually tuned to optimize the performance of the associated sub-system, further increasing manufacturing time and cost.

U.S. Pat. No. 4,924,191 issued to L. A. Erb et al. on May 8, 1990 discusses a solution to the various problems associated with utilizing analog feedback circuits (in this case, however, not for an optical system, but an electrical power amplifier). As disclosed, the operating bias point for an electrical power amplifier is stored in a computer memory. During frequent test intervals (when an incoming signal is interrupted), a test signal is passed through the power amplifier and a test bias point is measured. The test bias is then compared (by the computer) with the operating bias stored in memory. If they differ, the memory is updated to load the test bias value and the operation mode of the amplifier is re-started, where the updated value will be used to bias the amplifier until the next test period initiated. The computer, alternatively, may be programmed by the user to bypass the test mode and continuously run using a user-supplied bias voltage value.

One problem with the arrangement as disclosed by Erb et al. is that the electrical power amplifier must be frequently removed from service and tested to obtain up-dated operating parameters. For most optical communication system arrangements, such an interruption in performance is unacceptable. Thus, a need remains in the art for a means of optimizing the performance of optical communication arrangements in light of various environmental changes which avoids the various drawbacks associated with analog feedback circuitry solutions.

SUMMARY OF THE INVENTION

The need remaining in the prior art is addressed by the present invention which relates to performance optimization of an optical sub-system and, more particularly, to utilizing an embedded micro-controller to provide the desired optimization.

In accordance with an exemplary arrangement of the present invention, an optical sub-system arrangement, during manufacture, is subjected to a full range of environmental changes (e.g., minimum to maximum ambient temperature, input signal conditions, device(s) aging, etc.) and the required operating parameters (e.g., bias voltages) associated with optimum performance (e.g., minimum bit error rate) are recorded at a number of points chosen along the range of environmental changes and stored in a micro-controller embedded within the optical sub-system. Upon deployment, therefore, the embedded micro-controller monitors changes in the environment and adjusts the operating parameters in accordance with the stored values so as to continuously optimize the performance of the sub-system.

As an additional aspect of the present invention, the micro-controller may be configured to accept program changes from the user/customer so as to adapt the performance of the sub-system for particular conditions (e.g., non-optimum performance for supplying additional power or increased bit error rate constraints) which then override the values stored in memory.

It is an advantage of the present invention that each sub-system may be individually tuned such that the embedded micro-controller is tailored to optimize the sub-system performance. Such optimization may be beyond that which had been possible with analog feedback circuitry, thus increasing the manufacturing yield of the sub-system. Another advantage of an optical sub-system formed in accordance with the present invention is that the embedded micro-controller may be configured to maintain in memory all changes in operating parameters over the life of the sub-system. These changes are often of interest to the system design engineers with respect to future system designs.

Other and further advantages of the present invention will become apparent during the course of the following discussion and by reference to the accompanying drawings.

BRIEF DESCRIPTION OF THE DRAWING

Referring now to the drawings, where like numerals represent like components in several views.

DETAILED DESCRIPTION

Figure 1:
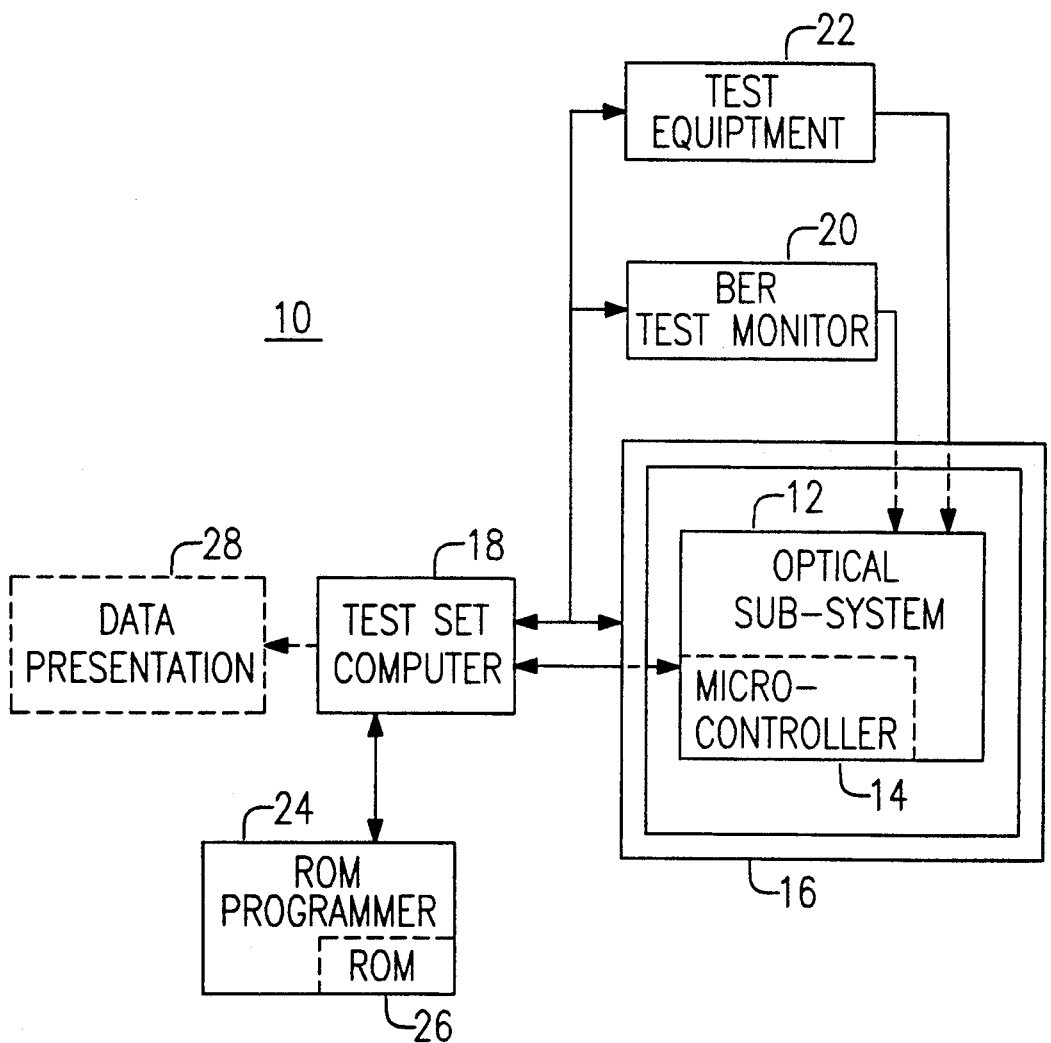
FIG. 1 illustrates, in block diagram form, an exemplary factory set-up for performing the initialization of an embedded micro-controller.

FIG. 1 illustrates, in block diagram form, an exemplary manufacturing line configuration 10 for initially programming the micro-controller portion of an optical sub-system in accordance with the teachings of the present invention. As discussed briefly above, in the implementation of the present invention, a selected optical sub-system, before field deployment, is subjected to the full range of environmental changes expected to be present over the lifetime of the sub-system. For most applications, the most important environmental changes are ambient temperature, input signal power levels, and the aging of individual device(s) within the sub-system. Configuration 10, as shown, is a useful arrangement for initially subjecting the optical sub-system to a predetermined set of environmental changes and recording the changes in sub-system parameters as a function of these environmental changes. Thus, when deployed in the field, the embedded micro-controller is utilized to modify the performance of the sub-system as the actual environment changes.

Looking in particular at configuration 10, an exemplary sub-system 12 (for example, a laser transmitter, APD receiver, optical amplifier or regenerator) including an embedded micro-controller 14 is placed in an oven 16. A test set computer 18 is provided in configuration 10 and is initially programmed to include the complete range of testing desired for the specific type of sub-system being studied. Test set computer 18, as shown in FIG. 1, then communicates the test program to embedded micro-controller 14. Test set computer 18 is also directly coupled to the controls of oven 16, as well as various other external testing devices (e.g., input signal attenuators). For example, test set computer 18 may also be coupled to a bit error rate (BER) test monitor 20. BER test monitor 20 is used, at each specific temperature under study, to locate the minimum bit error rate for an exemplary (worst-case) test signal. Additional test equipment 22 is utilized to vary the associated operating parameters of sub-system 12 (e.g., bias voltages, device temperatures, transimpedance gain) until the minimum BER is achieved. Once determined, the operating parameters associated with optimum performance at a specific temperature (and input signal level, perhaps) are transmitted back through test set computer 18 to a ROM programmer 24. Included within programmer 24 is a memory element 26, such as a ROM chip, which is programmed to store the data. ROM 26 will then be inserted in micro-controller 14 when the testing is completed. As an optional feature, the data generated by the testing process and transmitted back to test set computer 18 may also be displayed in any desired form (e.g., visual display, plot, graph, table, etc.) within a data presentation unit 28, as shown in phantom in FIG. 1. Upon completion of the testing process, ROM chip 26 is inserted within embedded micro-controller 14 to be packaged as a finished optical sub-system. Various other capabilities of the micro-controlled arrangement will become apparent as various specific applications are described in detail below.

Figure 2:
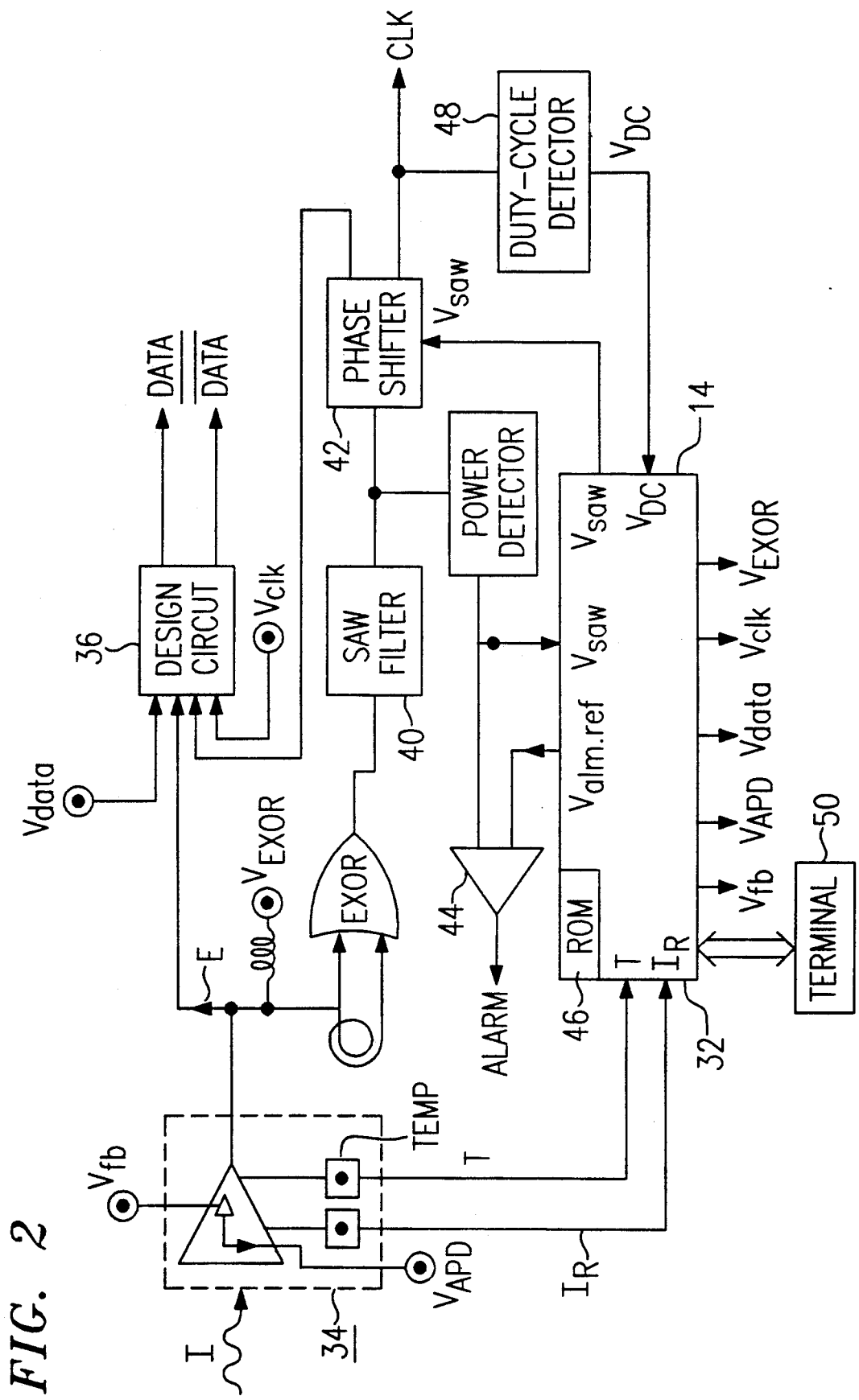
FIG. 2 illustrates an exemplary optical regenerator arrangement utilizing an embedded micro-controller to provide performance optimization in accordance with the teachings of the present invention.

FIG. 2 illustrates an exemplary regenerator arrangement 30 including an embedded micro-controller 32 in accordance with the teachings of the present invention. The operation of regenerator 30 will first be briefly described, and then the utilization of embedded micro-controller 32 will follow. In general, regenerator 30 is used in an optical communication system to restore (or "regenerate") an optical signal which must travel an extensive distance between transmitter and receiver. Basically, a regenerator functions to receive the optical signal propagating along the fiber, convert the optical signal into an electrical representation, re-create the electrical signal so as to include sharp transitions between logic "1"'s and logic "0"'s, and finally, re-convert the electrical signal into an optical signal to be re-coupled into the fiber. This process is shown in some detail in FIG. 2. An incoming optical data signal I is applied as an input to a receiver 34 which functions to convert the optical signal into the electrical representation. The electrical signal E is applied as an input to a decision circuit 36 which determines the logic value of each data bit as it passes through the circuit. The two outputs from decision circuit 36 are thus labeled Data and $\overline{\text{Data}}$. The clock signal is also extracted from the electrical signal E. Regenerator 30 of FIG. 2 performs clock recovery utilizing an exclusive-OR gate 38, SAW filter 40 and phase shifter 42, positioned in series as shown in FIG. 2. The output from phase shifter 42, the recovered clock signal Clk, is fed back as an input to decision circuit 36 to provide the correct timing of the data output signal. Clock signal Clk also appears as a separate output signal, as shown in FIG. 2, and may further be used to generate a signal indicating loss of transmission, referred to in FIG. 2 as an "Alarm" signal. A threshold detector 44 may be utilized to compare clock signal Clk to a reference voltage to generate the alarm signal.

As discussed above, embedded micro-controller 32 may be utilized to monitor a number of different operating parameters of regenerator 30 and provide adjustments, over time, to these parameters so as to continuously optimize the performance of regenerator 30 with respect to changes in the environment (e.g., temperature, device(s) aging, input signal level, power supply variations). Examples of various ones of these parameters will be now be discussed in detail below. It is to be understood, however, that these parameters are exemplary only, and any parameter (and any combination thereof) which may be measured and utilized to provide performance optimization in accordance with the teachings of the present invention. Referring to receiver 34 of FIG. 2, the ambient temperature T and photocurrent $I_R$ of receiver 32 may be transmitted as operating parameters to micro-controller 32 and utilized by ROM 46 (programmed as discussed above) to determine the optimum feedback voltage ($V_{fb}$) and photodetector bias voltage ($V_{APD}$) within receiver 34. As described above, prior to deployment, regenerator 30 is tested under various operating conditions and the parameters (such as feedback voltage and photodetector bias voltage) are measured to determine optimum values for various conditions. Thus, after deployment, the embedded micro-controller contains, within its memory, the optimum values associated with these conditions. Therefore, by continuously adjusting (as a function of temperature, for example) the reference voltages applied to the receiver 34, its performance can be optimized. As shown in FIG. 2, $V_{fb}$ and $V_{APD}$ are but one pair of outputs from micro-controller 32. The threshold voltages $V_{Data}$ and $V_{Clk}$ used to control the outputs from decision circuit 36 are also determined by micro-controller 32, since these voltages may also shift as a function of temperature. The reference voltage for alarm unit 44, denoted $V_{alm.ref}$ may also be set, as shown by micro-controller 32, with the actual power level of the clock signal, denoted $V_{alm}$ in FIG. 2, being sent back as data to micro-controller 32. A duty cycle detector 48 may be inserted in the clock output line to determine average DC value of the signal, where the DC voltage, denoted $V_{DC}$ in FIG. 2, may also be transmitted as data back to micro-controller 32.

As mentioned above, an additional feature of the present invention may include the ability to override the operation of micro-controller 32 after deployment such that predetermined values for selected operating parameters may be fixed to provide desired operating levels (i.e., maximize $V_{APD}$ to insure maximum sensitivity of receiver 34). As shown in FIG. 2, a terminal 50 may be coupled to micro-controller 32 and used to disable ROM 46 so as to freeze or modify any of the various outputs from micro-controller 32.

Figure 3:
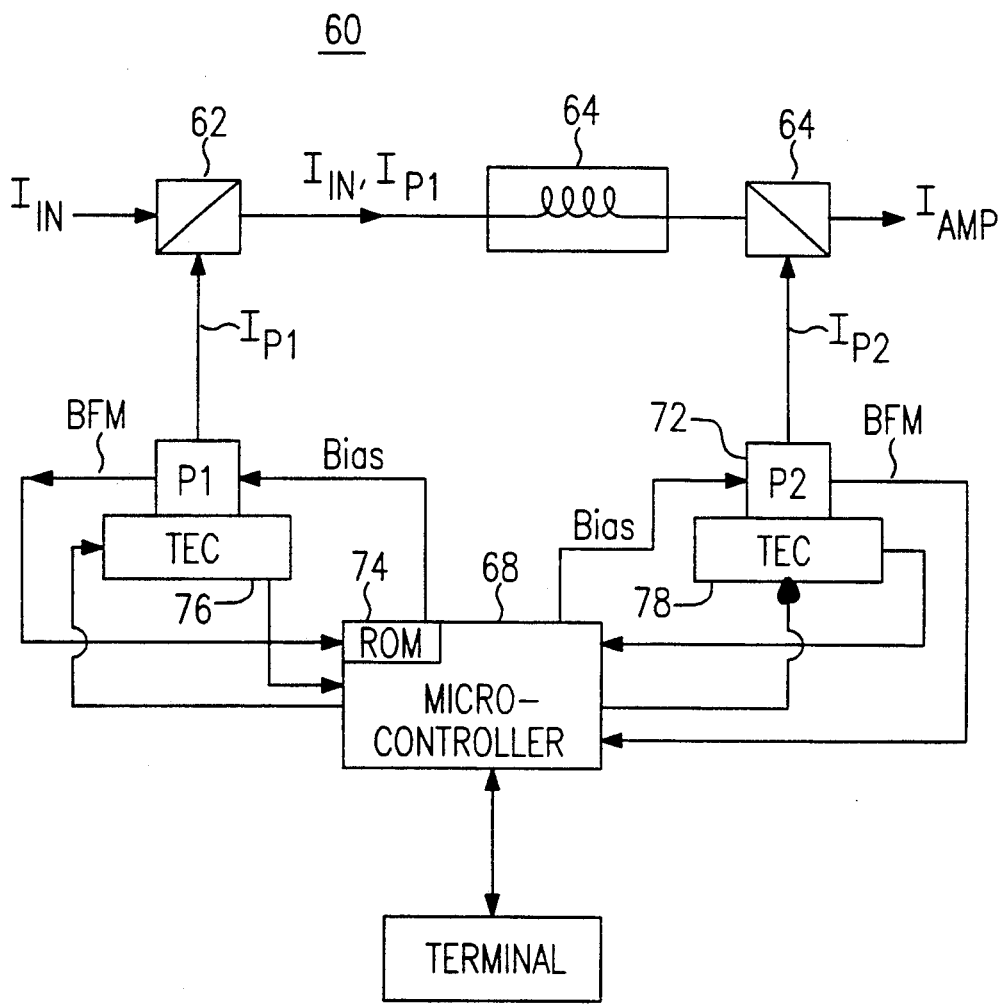
FIG. 3 illustrates an alternative application of micro-controller performance optimization, in particular, as utilized within a doped fiber optical amplifier arrangement.

FIG. 3 illustrates an alternative optical sub-system utilizing an embedded micro-controller to optimize performance in accordance with the teachings of the present invention. In particular, FIG. 3 contains a simplified diagram of an optical fiber amplifier 60. As is generally understood, an input optical data signal $I_{IN}$ and optical pump signal $I_P$ are applied as simultaneous inputs to a rare earth-doped optical fiber. The presence of a pump signal P at a particular wavelength (e.g., $\lambda_{pump}=0.98$ $\mu$m) results in providing amplification to the optical data signal. Referring to FIG. 3, the optical input signal $I_{IN}$ and a first pump signal $I_{P1}$ are coupled through a first wavelength multiplexer 62 into a section 64 of doped fiber. Since the amplification is independent of the propagation direction of the pump signal, a second pump signal $I_{P2}$ may be coupled by a second multiplexer 66 to the opposite end of doped fiber 64. As is well-known in the doped fiber amplifier art, the presence of the pump signal(s) results in providing gain to the optical data signal. Thus, the output from amplifier 60 will be an amplified version, $I_{AMP}$ of the input signal.

A problem with the arrangement as described above is that pump laser sources may be subject to aging, which may lower the pump laser's available output power, or worse, cause the wavelength of the pump laser to drift. As utilized in the fiber amplifier environment, it is preferred that the pump wavelength be maintained at a predetermined value, since the amount of gain is a result of Raman mixing at that wavelength. Therefore, in accordance with the teachings of the present invention, a micro-controller 68 is embedded within amplifier 60 and utilized to monitor and continuously optimize the performance of the pump lasers. It is to be noted that although only two such pumps lasers are shown, a fiber amplifier may use a larger number of such pumps and the teachings of the present invention remain applicable.

As with the regenerator arrangement described above, the micro-controller portion 68 of optical amplifier 60 is first initially programmed, using an arrangement such as manufacturing line configuration 10 of FIG. 1. As used with a doped optical fiber sub-system, test set computer 18 is utilized to vary the operating parameters associated with pump sources 70 and 72 as a function of changing environmental conditions (such as ambient temperature). A memory element 74, such as a ROM chip, within programmer 24 (see FIG. 1) is thus programmed to store the desired operating parameter values and subsequently inserted in micro-controller 68. For example, the light output (L) as a function of input bias current ($I_{bias}$) for pump sources 70 and 72 may be determined at each data point and the optimum bias current for maintaining sufficient power at a fixed wavelength is recorded and stored in ROM 74. Referring to FIG. 1, the BER test, for this purpose, may be replaced by an L-I test. As shown in FIG. 3, after deployment, the electrical signal generated by each backface monitor BFM (not shown) associated with sources 70 and 72 are directed as inputs to micro-controller 68, which uses this information to control, in this case the bias current applied to each pump. A pair of thermoelectric coolers (TECs) 76,78 is associated with sources 70 and 72, respectively, utilized to adjust the local temperature of the associated laser source so as to maintain maximum output power. As with the regenerator arrangement discussed above, micro-controller 68 may also be coupled to an external terminal 80 which is used to override the operation of ROM 74 and provide alternate predetermined operating parameters for use by optical amplifier 60.

It is to be understood that the embodiments of the present invention as described above are exemplary only, and an embedded micro-controller may be utilized with any desired optical sub-system to provide self-tuning and performance optimization as a function of various changes in the environment of the optical sub-system. For example, an embedded micro-controller may be utilized with a laser transmitter for the purpose of adjusting, for example, the laser temperature, bias current, and/or modulation current as a function of environmental conditions.

I claim:

1. An optical sub-system for producing an optical output signal in response to an optical input signal, wherein a plurality of operating parameters included within the optical sub-system may change in value as a function of variations in the optical sub-system environment, the changes resulting in unwanted variations in the optical output signal, wherein the improvement comprises a micro-controller embedded within the optical sub-system and including a memory programmed to include optimized values of operating parameters for preselected sets of environmental conditions, said micro-controller responsive to the plurality of operating parameters for comparing said plurality of operating parameters to the optimized values stored in memory and providing as an output to said sub-system optimized operating parameter values.

2. An optical sub-system as defined in claim 1 wherein the micro-controller memory comprises a ROM chip which is programmed during an initial test period to include the optimized values of the operating parameters.

3. An optical sub-system as defined in claim 1 wherein the micro-controller further includes means for overriding the values stored in memory and providing other preselected values of the operating parameters to the optical sub-system.

4. An optical sub-system as defined in claim 1 wherein the sub-system is a regenerator.

5. An optical sub-system as defined in claim 1 wherein the sub-system is a doped fiber optical amplifier.

6. An optical sub-system as defined in claim 1 wherein the sub-system is a laser transmitter.

* * * * *